(12) United States Patent
Mohan

(10) Patent No.: US 8,191,034 B1
(45) Date of Patent: May 29, 2012

(54) METHOD AND SYSTEM FOR MEASURING TERMINAL COMPATIBILITY AND ALIGNMENT

(75) Inventor: Muni B. Mohan, San Jose, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 16 days.

(21) Appl. No.: 12/888,766

(22) Filed: Sep. 23, 2010

(51) Int. Cl.
*G06F 11/22* (2006.01)
*G06F 17/50* (2006.01)

(52) U.S. Cl. ........................................ 716/136
(58) Field of Classification Search .................... 716/136
See application file for complete search history.

(56) References Cited

U.S. PATENT DOCUMENTS

| 2008/0143379 A1* | 6/2008 | Norman ........................... 326/39 |
| 2011/0102011 A1* | 5/2011 | Van Der Plas et al. .. 324/762.03 |
| 2011/0161748 A1* | 6/2011 | Casper et al. ................. 714/708 |

OTHER PUBLICATIONS

Gabriel H. Loh, Yuan Xie, Bryan Black, "Processor Design in 3D Die-Stacking Technologies," IEEE Micro, vol. 27, No. 3, pp. 31-48, May/Jun. 2007.

* cited by examiner

*Primary Examiner* — Suresh Memula
(74) *Attorney, Agent, or Firm* — Rosenberg, Klein & Lee

(57) ABSTRACT

A method and system are provided for automatically verifying terminal or bump compatibility in a stacked multi-chip architecture during integrated circuit design verification by comparing interfacing terminal layers from a first chip layout file and a second chip layout file and flagging connectivity problems or features that may give rise to problems and displaying these flagged problems or features to a user.

21 Claims, 10 Drawing Sheets

METHOD AND SYSTEM FOR MEASURING TERMINAL COMPATIBILITY AND ALIGNMENT

BACKGROUND OF THE INVENTION

1. Field of the Invention

The present invention is generally directed to a method and system for measuring terminal compatibility and alignment. More specifically, the present invention is directed to a method and system of reading separate chip layout files and assessing their compatibility, in terms of such considerations as the geometry, interconnection, signal, and power therebetween, during a verification stage before actual fabrication.

2. Description of the Related Art

In Integrated Circuit (IC) design, it is often desirable to combine separate chips or dies into a single interconnected stacked-chip package. Generally each separate microchip, chip, or die (used interchangeably herein) typically goes through many stages of verification to ensure proper functionality. Before a chip is fabricated, a computer readable representation including physical dimensions of component parts and various other defining data are stored as a chip layout file. While the chip layout file may already have been extensively formally verified, no tools presently exist to accurately and efficiently verify compatibility between chips to be stacked and interconnected in a sufficiently automated manner.

In Electronic Design Automation (EDA), specifically checking for inter-die connectivity of micro-bumps/ball bumps/bumps/μ-bumps/terminals/bump pads/ solder bumps/ bump metal (used interchangeably herein) and Through-Silicon Vias (TSVs) involving two or more dies requires very time consuming and error prone manual checking/visual inspection. Presently, when manufacturers attempt to check inter-die connectivity they typically print out a large floor plan of a circuit or a chip design and then print out another interfacing design and try to scale and align the two. A painstaking visual inspection of each and every terminal on both chips is then manually performed.

The process of visually inspecting and searching for bumps that do not align, are differently shaped/sized, or may represent differing signals is very tedious. Designers have to manually inspect and visually correlate the respective floor plan of the given layouts while cross-referencing spreadsheets, net lists, and label lists for their defining features and properties.

This approach is not very practical as many errors are often made and alignment problems may be missed. Unfortunately, no automated tool is available to effectively aid in this inspection. In fact, EDA tools heretofore known are without sufficient measures to deal with but one chip design database or chip layout at a time. Presently available tools cannot concurrently evaluate multiple separate and distinct chip layout databases and reliably asses the necessary aspects of connectivity therebetween.

The current practice of rendering the separate chip layout designs and incorporating bump pad text of signal and power mapping files, then visually inspecting each and every microbump is a very inefficient, error prone, and labor-intensive manner of performing such a verification.

If a problem was found during this manual/visual inspection, the designers would have to go back, modify designs, and iterate through this visual check over and over again which compounds the inefficiency of the present approach. Consequently, time delays, budget overruns, and inefficiencies are introduced into the overall manufacturing process.

There is therefore a need for a method and system for automatically verifying chip compatibility for stacked multi-chip implementation that doesn't rely on manual human visual inspection of each individual bump element.

SUMMARY OF THE INVENTION

An object of the present invention is to provide a system and method for measuring terminal compatibility and alignment.

Another object of the present invention is to provide a system and method for verifying compatibility of chips for stacked multi-chip implementation.

Another object of the present invention is to provide a system and method for verifying terminal compatibility in a stacked multi-chip architecture.

Another object of the present invention is to provide a system and method for aiding in the debugging of interconnections between stacked microprocessors.

It is yet another object of the present invention to provide a system and method for verifying terminal alignment in a stacked multi-chip architecture.

It is yet another object of the present invention to provide a system and method for verifying geometric alignment, or executing shape-based design rule checking (DRC), also referred to herein as XOR checking.

It is yet another object of the present invention to provide a system and method for ensuring suitable electrical properties of the stacked multi-chip architecture in an electrical rule checker (ERC) system.

It is yet another object of the present invention to provide a system and method for the automation of structural integrity and functional integrity verification.

These and other objects are attained by a method and system implemented in accordance with the present invention.

The method includes establishing a plurality of chip layout files corresponding to respective chips to be combined in stacked multi-chip manner, each chip layout file defining at least one interfacing terminal layer including a plurality of terminals for interconnection with another chip to be stacked therewith.

An intermediate layer is formed and disposed between the first and second interfacing terminal layers, the intermediate layer including a plurality of Through-Silicon Vias (TSVs), each defined to interconnect selected terminals of the first and second interfacing terminal layers;

Both a structural integrity check, the structural integrity check including an interconnection survey between the terminals of the first and second interfacing terminal layers; and a functional integrity check are performed, the functional integrity check including characterization of interconnections between terminals of the first and second interfacing terminal layers with respect to a predetermined signal and power map, and;

Any terminals of the first and second interfacing terminal layers failing at least one of the structural and functional integrity checks are identified to the user.

Another exemplary embodiment provides a system for measuring terminal compatibility comprising:

a computer processor;

a storage memory coupled to said computer processor via a bus;

a computer program figured to include software modules including:

a layout module, operable to provide and maintain a plurality of chip layout files corresponding to respective chips to be combined in stacked multi-chip manner, each chip layout file defining at least one interfacing terminal layer including a plurality of terminals for interconnection with another chip to be stacked therewith;

a TSV forming module, operable to form an intermediate layer disposed between the first and second interfacing terminal layers, the intermediate layer including a plurality of Through-Silicon Vias (TSVs), each defined to interconnect selected terminals of the first and second interfacing terminal layers;

a structural integrity check module, operable to perform a structural integrity check, the structural integrity check including an interconnection survey between the terminals of the first and second interfacing terminal layers;

a functional integrity module, operable to perform a functional integrity check, the functional integrity check including characterization of interconnections between terminals of the first and second interfacing terminal layers with respect to a predetermined signal and power map, and;

an identifying module, operable to identify for a user, any terminals of the first and second interfacing terminal layers failing at least one of the structural and functional integrity checks.

Yet another exemplary embodiment provides a computer program product for use with a computer, the computer program product comprising a tangible computer usable medium having a computer readable program code embodied therein for verifying chip compatibility for stacked multi-chip implementation comprising:

establishing a plurality of chip layout files corresponding to respective chips to be combined in stacked multi-chip manner, each chip layout file defining at least one interfacing terminal layer including a plurality of terminals for interconnection with another chip to be stacked therewith;

forming an intermediate layer disposed between the first and second interfacing terminal layers, the intermediate layer including a plurality of Through-Silicon Vias (TSVs), each defined to interconnect selected terminals of the first and second interfacing terminal layers;

performing a structural integrity check, the structural integrity check including an interconnection survey between the terminals of the first and second interfacing terminal layers;

performing a functional integrity check, the functional integrity check including characterization of interconnections between terminals of the first and second interfacing terminal layers with respect to a predetermined signal and power map, and;

identifying for a user, any terminals of the first and second interfacing terminal layers failing at least one of the structural and functional integrity checks

DETAILED DESCRIPTION OF THE PREFERRED EMBODIMENTS

In the design and implementation of integrated circuits having a stacked multi-chip architecture, it is important to accurately and efficiently compare interconnections and ensure compatibility between two or more distinct chips in the stacked multi-chip architecture. Typically, designers of chips to be interconnected in a stacked arrangement would manually adjust the scale of chip representation and accordingly render the layouts or floor plans for the chips that to be interconnected. The designers would then physically and visually align the chips and visually inspect each and every terminal or micro-bump that they were hoping to interconnect. This is obviously very time-consuming and error prone. The time delays and costs associated with such a procedure are compounded as chips are revised and iterated through this design and electrical checking process repeatedly.

In accordance with an embodiment of the present invention, a system and method for automatically verifying terminal compatibility in a stacked multi-chip architecture is provided.

Figure 1:
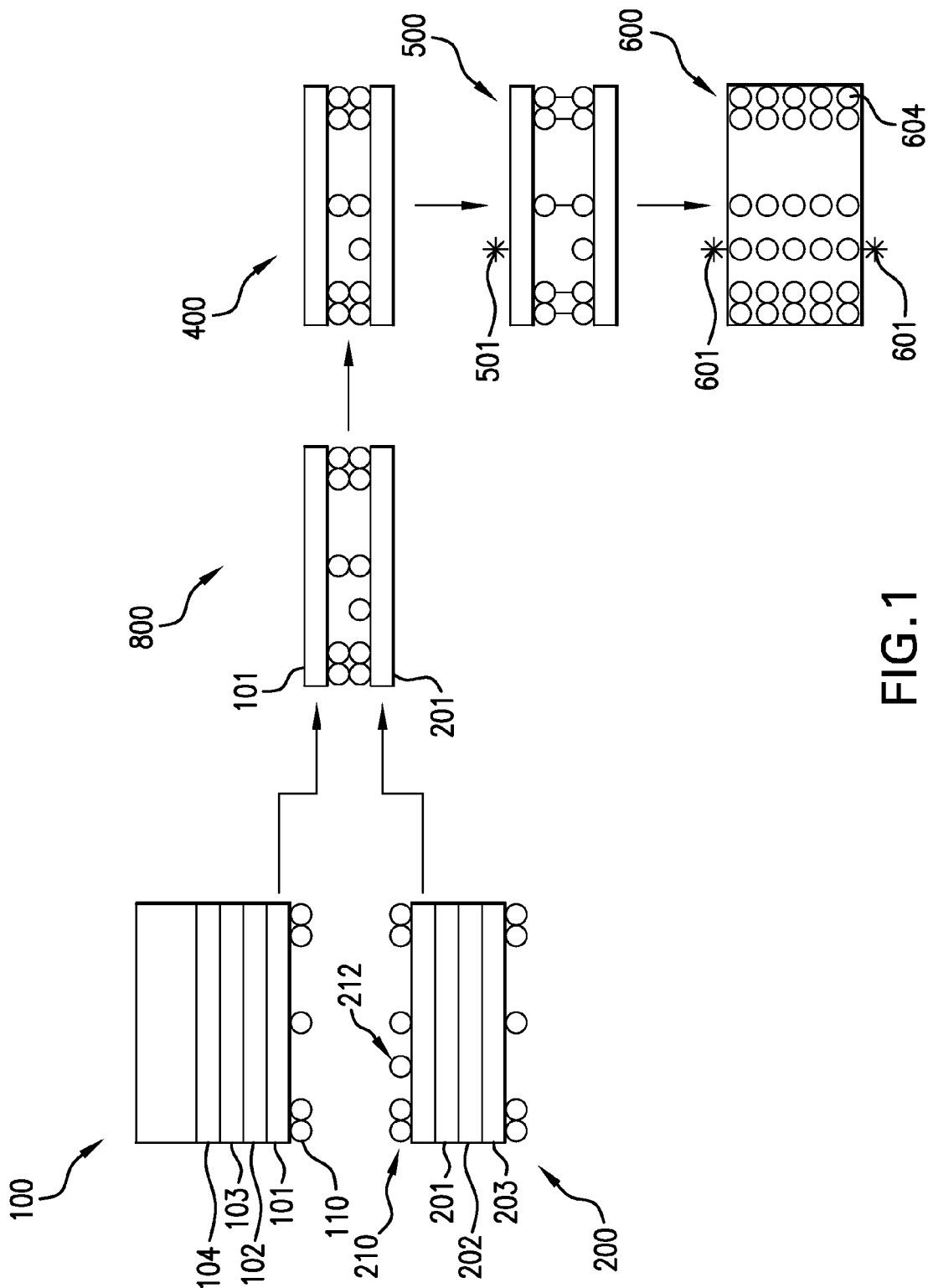
FIG. 1 is a flow diagram of a method for verifying terminal compatibility in stacked multi-chip architecture in accordance with one exemplary embodiment of the present invention.

FIG. 1 illustrates a flow diagram for such an automated method for verifying terminal compatibility in a stacked multi-chip architecture, in accordance with an exemplary embodiment of the present invention. A first chip layout file 100 having a plurality of layers 101, 102, 103, 104 . . . , and a plurality of interconnecting terminals, or bumps, or micro-bumps 110 is established. A second chip layout file 200 also having a plurality of layers 201, 201, 203, . . . is also provided or established. The second chip layout file is similarly provided with a plurality of interconnecting terminals or micro-bumps. In a stacked multi-chip architecture, it is preferably envisioned that a first micro-chip represented by the first chip layout file 100 would be vertically stacked with the second chip layout file or with a chip represented by the second layout file 200.

When these two chips are combined, only layers 101 and 201, the corresponding interfacing terminal layers, are of interest. Therefore, a temporary test layout file 300 may optionally be created and the interfacing terminal layer 101 from the first chip layout file 100 and the interfacing terminal layer 201 from the second chip layout file 200 are extracted and inserted into the temporary or intermediate test chip layout file 300. In a preferred, embodiment, no temporary test layout file 300 is created; rather, the layers of interest are considered in vivo, where they lie, in the respective chip layout files.

The two interfacing terminal layers are separated, a space is interposed therebetween, and an intermediate layer of through-silicon vias (TSVs), or interlayer connecting devices, are formed in-between. In one embodiment, this is done using a logical AND operation and creating the TSVs wherever two corresponding micro-bumps are found on the two corresponding interfacing terminal layers 101 and 201.

In the second chip layout file 200, it can be seen that a micro-bump 212 does not have a corresponding micro-bump on the first chip layout file 100—so at step 400, a logical AND operation will not result in a TSV being formed on the micro-bump 212 found at step 400.

Conversely, it is seen that all other pairs of micro-bumps do have a through-silicon via or vertical inter-layer conductive element interposed therein-between. Therefore, at step 500, bump pad 212 that does not have a mate on the upper most interfacing terminal layer is flagged 501.

This flagging may be done either visually or stored in a database, list, or by any other data recording means as would be known to one of ordinary skill in the art. The flagging 501 enables a chip designer to see and quickly debug and remedy interconnection problems or bumps that do not have a mating bump. Such a lack of a mating bump could be fatal to interconnection between a stacked multi-chip set.

Step 600 shows another data view representation of a planar layout of the chip shown in the test layout file of step 500. It is seen here that each row of micro-bumps, such as micro-bump pair 604 shown as two concentric circles has two bump pads in linear registration. Therefore, some visual indicia to indicate to the user that there is indeed a pair of corresponding bump pads between the two interfacing terminal layers of the test layout file are present. Preferably, the visual indicia is color-based to capture the user's attention and conspicuously convey information.

In contradistinction to the majority of bump pad pairs shown in 600, it is seen that the row of humps 601 being flagged are not, or do not form pairs; they lack a corresponding mating bump on one of the two interfacing terminal layers of the test layout file.

Figure 2:
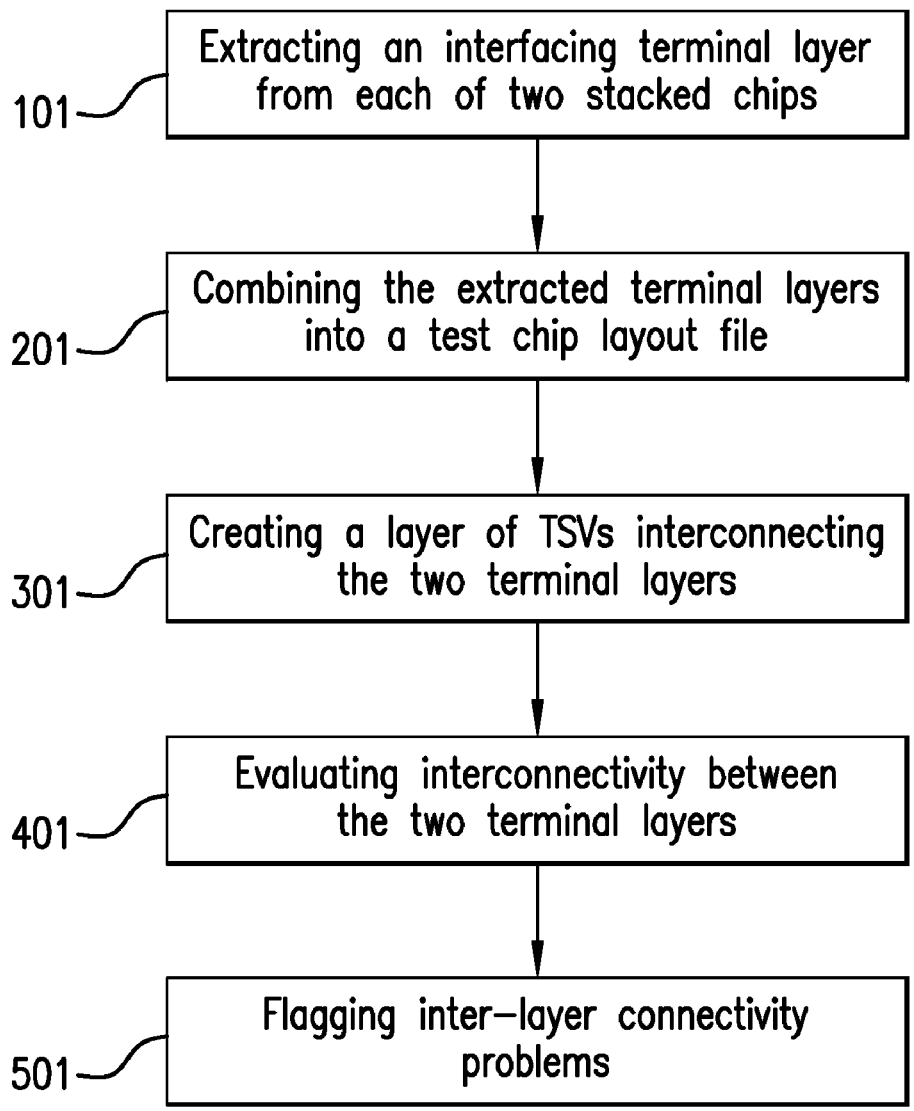
FIG. 2 is a flow diagram of a method for verifying terminal compatibility in a stacked multi-chip architecture in accordance with the embodiment shown in FIG. 1.

FIG. 2 is a simplified flow diagram of a method for verifying terminal compatibility in a stacked multi-chip architecture in accordance with an embodiment of the invention of the subject Patent Application. At step 101, interfacing terminal layers are extracted from each of two stacked chips. Alternatively, all of the non-interfacing terminal layers are discarded, not considered, rendered invisible to the user, or merely de-emphasized. Throughout the verification process each individual chip has been thoroughly tested and verified so of concern now is just the interconnection between the two verified chip databases or chip layout files.

At step 201, the extracted terminal layers may optionally be inserted into a test layout file. The test chip layout file or test layout file (used interchangeably herein), for ease of computation, may just have the two interfacing terminal layers from the first chip layout file and the second chip layout file and may exclude other non-interfacing layers. Alternatively the interfacing terminal layers may be considered, where they lie (in their original respective chip layout files).

At step 301, a layer of through-silicon vias (TSVs) are created and interposed in between the two interfacing terminal layers to interconnect those two terminal layers.

At step 401, the interconnectivity between the two interfacing terminal layers is evaluated. During step 401, each terminal is evaluated on both of the two interfacing terminal layers to determine if it is indeed connected between interfacing terminal layers or if it is in an open connection, meaning that the circuit is not completed.

Optionally, the interconnectivity of each terminal can be further evaluated for shorts, opens, signal mismatches or properties that may lead to undesirable signal parasitics or other problems.

At step 501, any of these interconnectivity problems can be flagged for later debugging or remedy.

Figure 3:
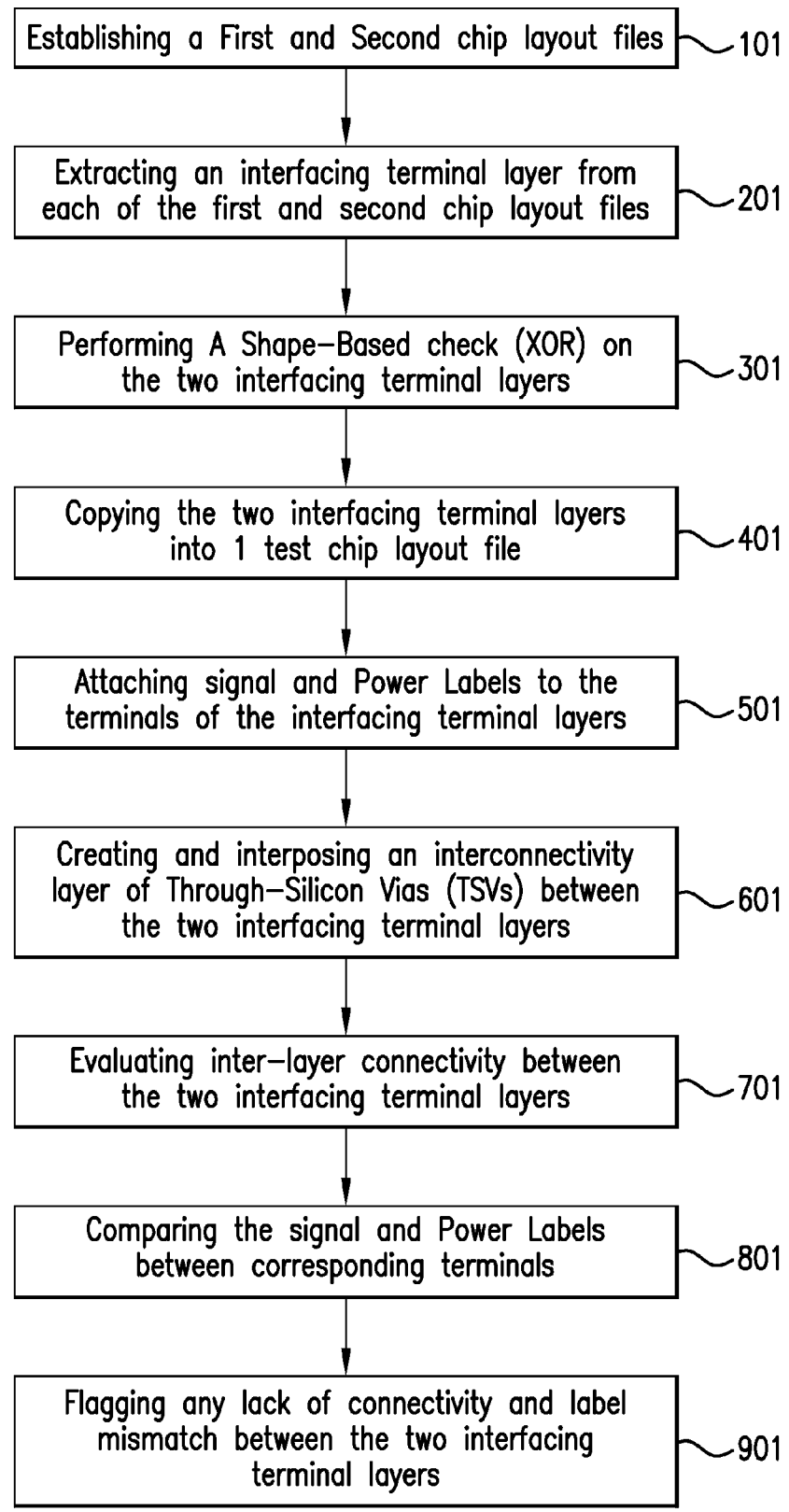
FIG. 3 is a flow diagram of a method for verifying terminal compatibility in a stacked multi-chip architecture in accordance with another exemplary embodiment of the present invention.

FIG. 3 is another simplified flow diagram of a method for verifying terminal compatibility in a stacked multi-chip architecture. At step 101 a first and second chip layout file are provided. Each of these chip layout files is generally a very detailed layout including physical dimensionality and geometrical parameters of the schematic of a microprocessor chip. Again, both the first and second chip layout files, at this point of the process, have already been through extensive error checking and formal verification. Herein we are focusing on the interconnection between the first and second chip layout files as being representative of a first and second microchip that will be stacked and interconnected.

At step 201, we are focusing the verification, checking, and debugging by extracting an interfacing terminal layer from each of the first and second chip layout files. This allows a designer to focus debugging and error checking solely on the pertinent and relevant interfacing terminal layers.

At step 301, a shape-based check (XOR) or design rule check (DRC) is performed on the two interfacing terminal layers. Essentially, the geometry of the two interfacing terminal layers or their silhouettes are checked to ensure that they are geometrically symmetric. At this stage the connectivity is preferably ignored.

At step 401 the two interfacing terminal layers may optionally be copied into a single test chip layout file. This single test layout file is, in a sense, pseudo, constructive, or artificial as a chip just having these two interfacing terminal layers will not actually be produced. This test layout file merely allows the evaluation of interconnectivity problems between the interfacing terminal layers. Alternatively, the two interfacing terminal layers may be considered where they lie, in their respective chip layout files.

At step 501, signal and power labels are preferably attached to the terminals of the interfacing terminal layers.

At step 601, an interconnecting layer of through-silicon vias (TSVs) are created and interposed between the two interfacing terminal layers. Thereby, each of the corresponding micro-bumps on the two interfacing terminal layers are connected. One may create these TSVs through a logical AND operation forming TSVs only at the occurrence of corresponding micro-bumps between the two interfacing terminal layers.

At step 701, the inter-layer connectivity between the two interfacing terminal layers is evaluated. The connectivity between each terminal of each interfacing terminal layer is evaluated to see whether it is indeed connected in an inter-layer manner, providing a circuit from the lower-most layer up to the higher-most layer or conversely from the higher-most layer down to the lower-most layer.

At step 801, the signal and power labels are compared between corresponding terminals of the two interfacing terminal layers. For example, a particular terminal may be labeled signal A and be intended to mate with a corresponding terminal on an opposing interfacing terminal layer also labeled signal A. If indeed the first terminal, labeled A, mates with an opposing yet corresponding terminal B, a signal mismatch may have occurred.

At step 901, any lack of connectivity and/or label mismatch between two interfacing terminal layers is flagged. This flagging, as discussed supra may be through any means known in the art.

In various embodiments of the invention, the system may be implemented in the form of software modules or hardware modules. In an embodiment of the invention, the system is implemented as part of an electronic design automation (EDA) system.

Figure 4:
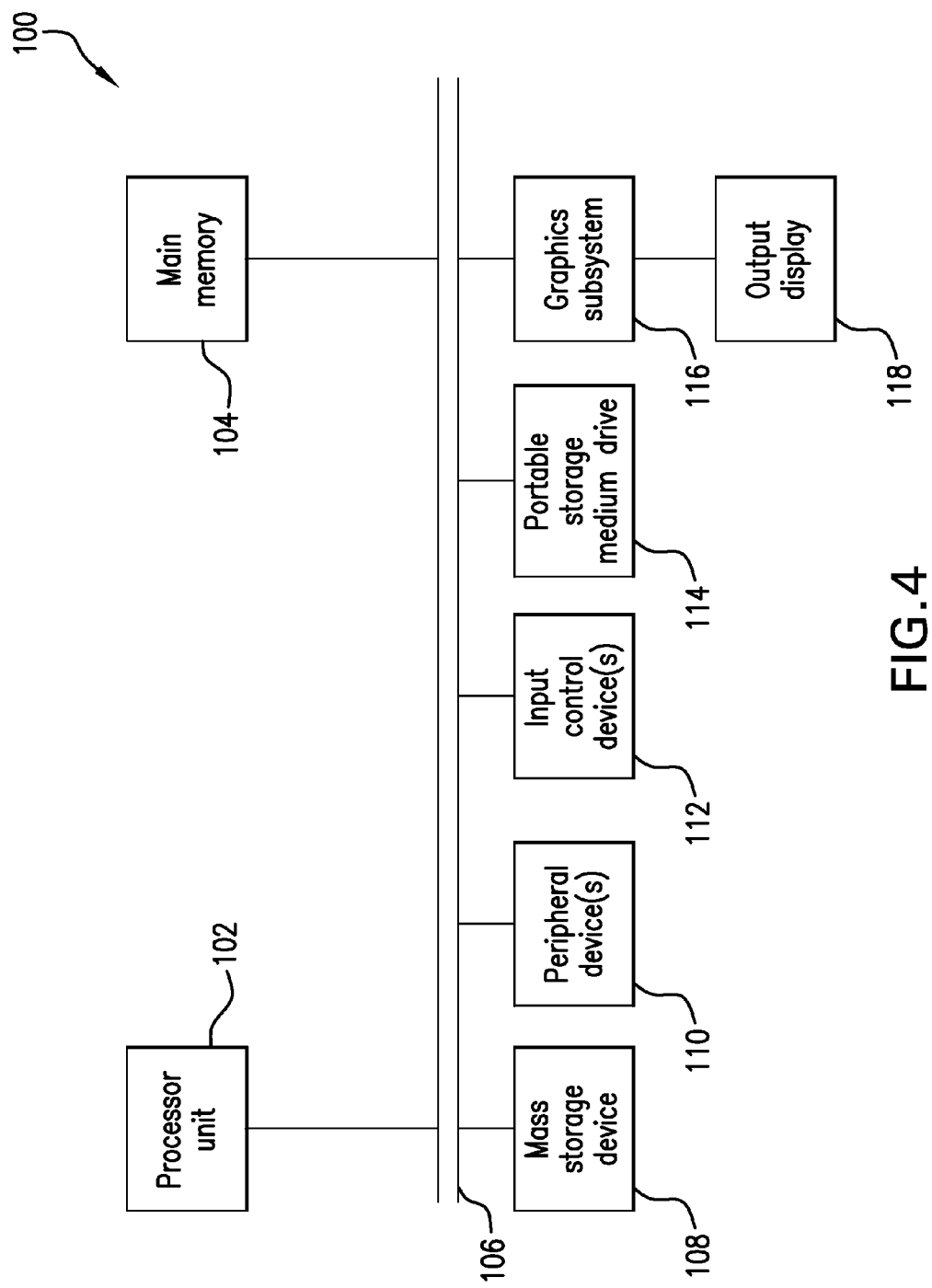
FIG. 4 is a schematic diagram of a system in accordance with another exemplary embodiment of the present invention.

FIG. 4 illustrates a block diagram of a computer system for executing electronic design automation and 3-D integrated circuit verification, in accordance with various embodiments of the present invention. A computer system 100 contains a processor unit 102, a main memory 104, an interconnect bus 106, a mass storage device 108, peripheral device(s) 110, input control device(s) 112, portable storage drive(s) 114, a graphics subsystem 116, and an output display 118. Processor unit 102 may include a single microprocessor or a plurality of microprocessors for configuring computer system 100 as a multi-processor system. Main memory 104 stores, in part, instructions and data to be executed by processor 102. Main memory 104 preferably includes banks of dynamic random access memory (DRAM) as well as high-speed cache memory.

For the purpose of simplicity, the components of computer system 100 are connected via interconnect bus 106. However, computer system 100 may be connected through one or more data transport means. For example, processor unit 102 and main memory 104 may be connected via a local microprocessor bus and mass storage device 108, peripheral device(s) 110, portable storage medium drive(s) 114, and graphic subsystem 116 may be connected via one or more input/output (I/O) buses. Mass storage device 108, which may be implemented with a magnetic disk drive, an optical disk drive, a solid state device, or an attachment to network storage, is non-volatile storage device for storing data, databases, and instructions, to be used by processor unit 102. In a software embodiment, mass storage device 108 may store the software to load it into main memory 104.

Portable storage medium drive 114 operates in conjunction with a portable non-volatile storage medium such as a floppy disk, a compact disk read only memory (CD-ROM), or a digital versatile disk read only memory (DVD-ROM), to input and output data and code to and from the computer system 100. In one embodiment, the software is stored on such a portable medium, and is input to computer system 100 via portable storage medium drive 114. Peripheral device(s) 110 may include any type of computer support device such as an input/output (I/O) interface, to add additional functionality to computer system 100. For example, peripheral device(s) 110 may include a network interface card to interface computer system 100 to a network.

Input control device(s) 112 provide a portion of the user interface for a computer system 100 user. Input control device(s) 112 may include an alphanumeric keypad for inputting alphanumeric and other key information; and a cursor control device such as a mouse, a track pad or stylus; or cursor direction keys.

In order to display textual and graphical information, computer system 100 contains graphic subsystem 114 and output display(s) 118. Output display 118 may include a cathode ray tube (CRT) display, liquid crystal display (LCD), plasma, or active matrix organic light emitting diode (AMOLED) display. Graphic subsystem 116 receives textual and graphical information and processes the information for output to display 118.

In a software implementation, the EDA software includes a plurality of computer executable instructions, to be implemented on a computer system. Prior to loading in the computer system, the EDA software may reside as encoded information on a computer-readable tangible medium such as a magnetic floppy disk, a magnetic tape, CD-ROM, DVD-ROM, flash memory, or any other suitable computer readable medium, In a hardware implementation, such a system may be implemented in any suitable computer based platform known in the art. For example, the system may comprise suitable storage media and one or more dedicated processors or share one or more processors executing/controlling other functions, wherein the employed processor(s) is programmably configured with processor instructions for performing the functions described herein. Suitable circuits may also be developed to execute certain aspects of these functions.

Figure 5:
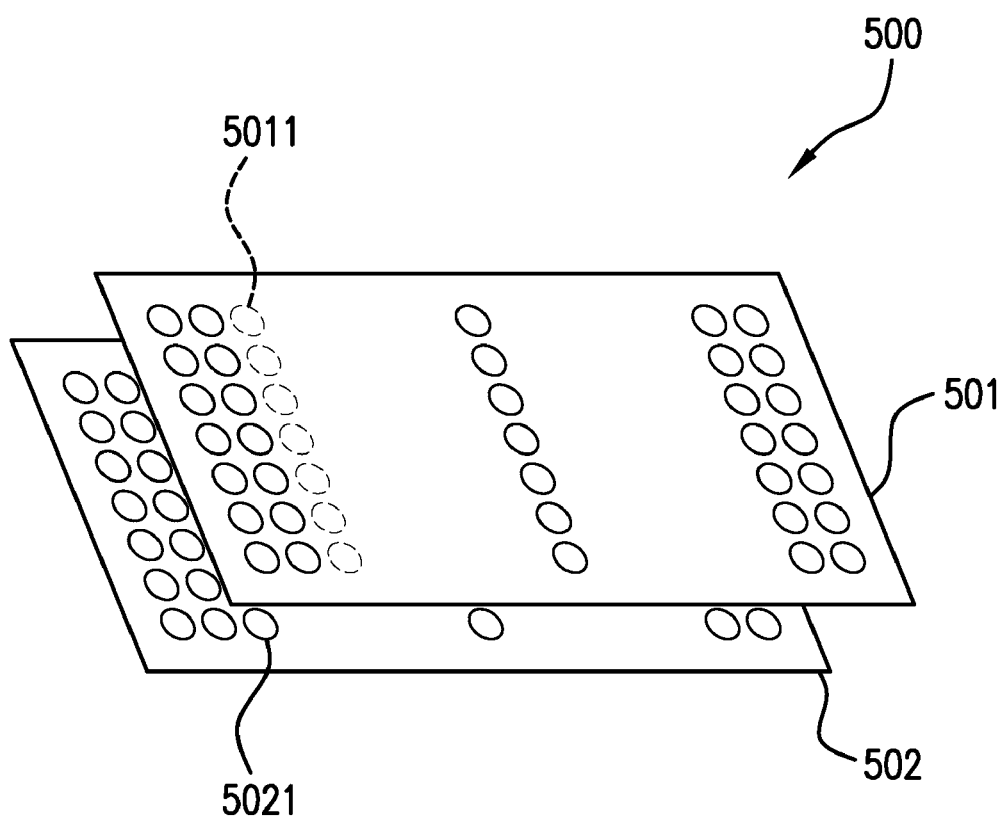
FIG. 5 is a perspective view of an exemplary stacked multi-chip architecture.

FIG. 5 is a simplified perspective view of a stacked multi-chip architecture 500. A first chip 501 having a plurality of micro-bumps is stacked above a second chip 502 also having a plurality of micro-bumps. It is seen on the second chip 502 that there exists a plurality of micro-bumps 5021 which do not have corresponding micro-bumps on the first chip 501. It is seen that while no micro-bumps corresponding to the micro-bumps 5021 on the second chip 502 are present on the first chip 501 it is seen through broken line relief that the micro-bumps are present on the lower chip 502. These micro-bumps 5011 are seen through the first chip 501.

Figure 6:
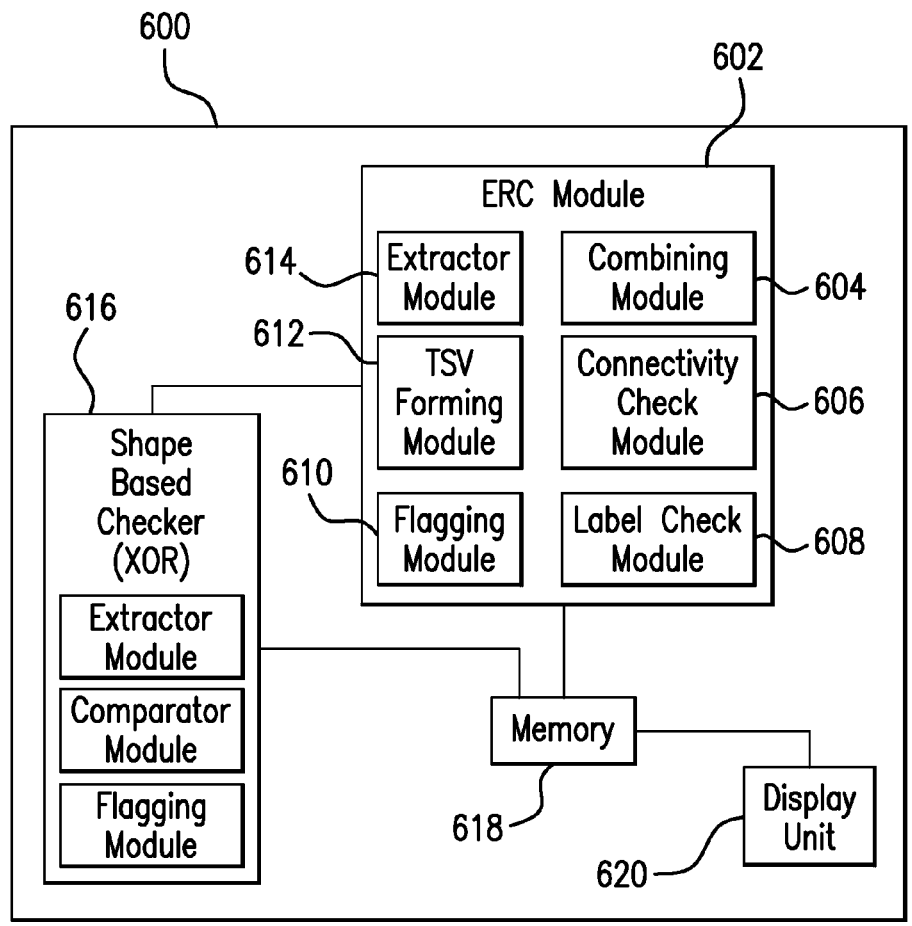
FIG. 6 is a schematic diagram of a system for verifying terminal compatibility in a stacked multi-chip architecture in accordance with another exemplary embodiment of the present invention.

FIG. 6 is a simplified schematic of a system for verifying terminal compatibility in a stacked multi-chip architecture implemented in hardware. In ERC module 602 or electrical rule check module there are a plurality of sub-modules including a combining module 604, a connectivity check module 606, a label check module 608, flagging module 610, TSV forming module 612, and extractor module 614. This module will be responsible for performing electrical rule checks between the two interfacing terminal layers of the two chip layout files by extracting the two interfacing layers, combining those two interfacing terminal layers, forming TSVs therein-between, checking the connectivity therein-between, flagging connectivity failures and label mismatches.

Module 616 is a shape-based checker (XOR) module in the design rule check stage. It has an extractor sub-module 622, a comparator sub-module 624, and a flagging sub-module 626. The shape-based checker module will extract the two interfacing terminal layers from the first and second chip layout files, compare those two layers, and flag any geometrical mismatches.

Memory 618 may store the individual chip layout files, the intermediary test layout file, and a database, list, or record to store flagged information on mismatches. Display unit 620 may be used to display to the user any flagged mismatches or terminal interconnection problems.

Figure 7:
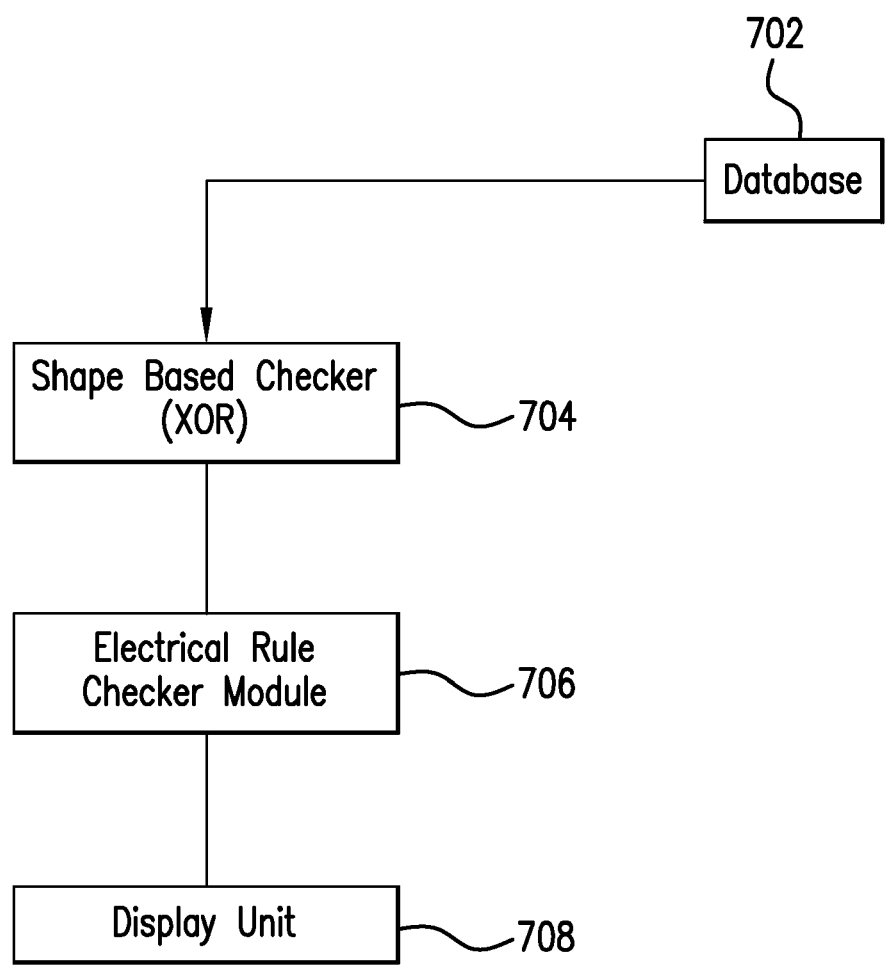
FIG. 7 is a simplified schematic diagram of a system for verifying terminal compatibility in a stacked multi-chip architecture in accordance with an exemplary embodiment of the present invention.

FIG. 7 shows a first database 701 optionally used to store a first chip layout file, and a second database 702, optionally used to store a second distinct chip layout file. A shape-based checker module (XOR) is represented as 704. An electrical rule checker module 706 is shown. And lastly, a display unit 708 is shown.

Figure 8:
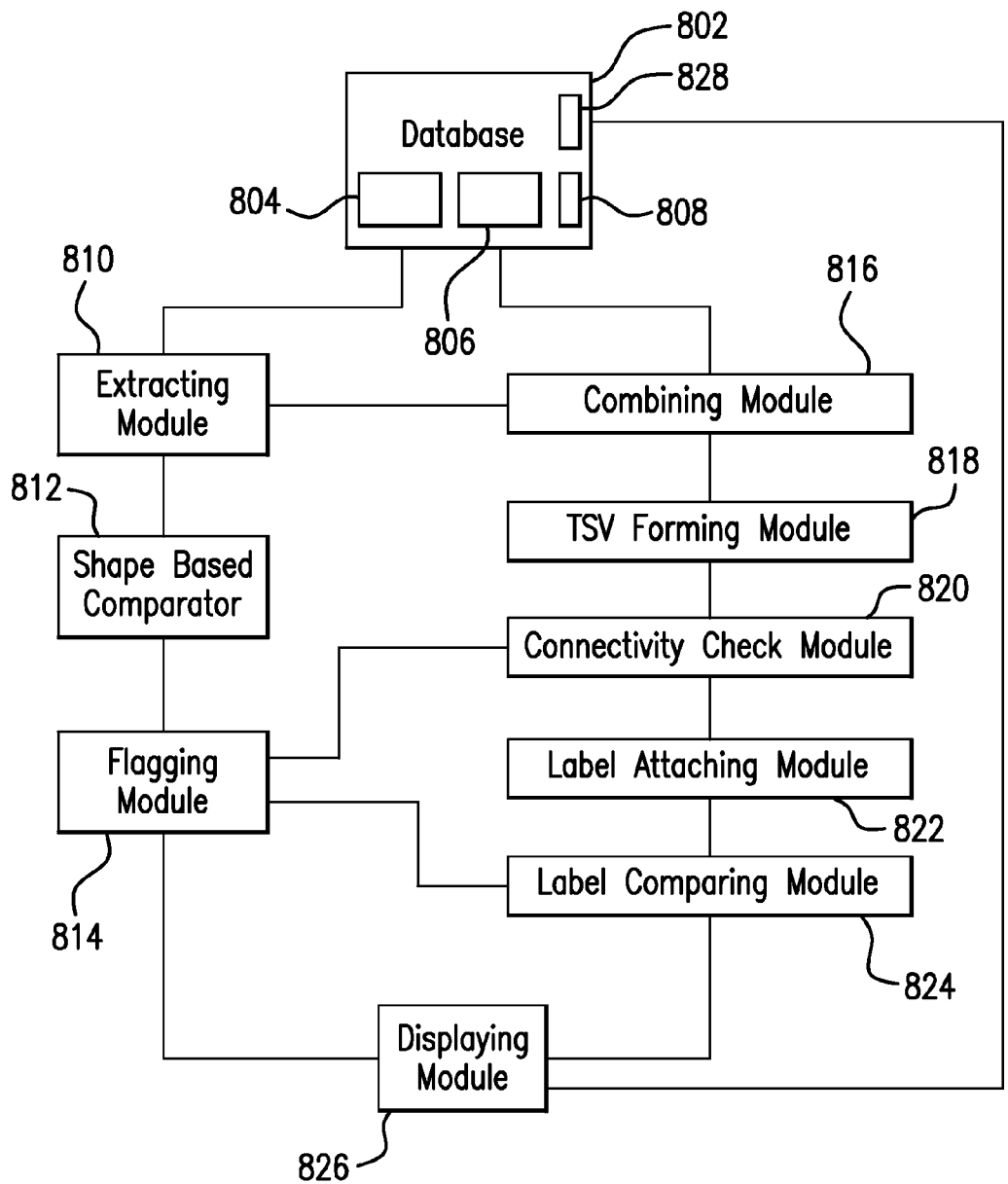
FIG. 8 is a schematic diagram of a system for verifying terminal compatibility in a stacked multi-chip architecture in accordance with another exemplary embodiment of the present invention.

FIG. 8 shows a first storage 802 having a plurality of subsections 804, 806, 828, and 808 used potentially for storing the first chip layout file, the second chip layout file, the test layout file, and/or a database of flagged conditions respectively.

It is seen that an extracting module 810 is interconnected between the storage module 802, the combining module 816, and the shape-based comparator 812. A flagging module 814 is interconnected between the shape-based comparator, the connectivity check module 820 and the label comparing module 824.

A displaying module 826 is interconnected between a flagging module and the storage module 802. An ordinary traversal through this system may originate at storage modules 804 and 806 respectively representing the first and second chip layout files progressing to the extracting module 810 to extract the interfacing terminal layers from each of the first and second chip layout files, progressing to the combining module 816 which may combine the extracted terminal layers into a temporary test layout file 808, and then progress to a through-silicon via or TSV forming module 818 while, optionally, in parallel, a structural integrity/compatibility check is started which preferably includes a shape-based comparator to act on the test layout file 808 and thereby any shape-based mismatches are passed on to flagging module 814 to store in a temporary database 828 on shape-based mismatches.

The structural integrity check preferably also includes an electrical rule check (ERC) check, whereby connectivity check module 820 evaluates the interconnectivity of each terminal in the interfacing terminal layers. Any lack of interconnectivity such as opens, short conditions, physical parameters of each individual terminal that may indicate a degraded connectivity, or potentially any other type of discovered problems are flagged at flagging module 814.

A functional integrity check preferably includes a label attaching module 822 which may then be activated to attach further refining properties, signal types, power types, phase, expected voltages, physical shape, inherent characteristics, or any other functional properties of each individual terminal of the interfacing terminal layers. Such a system would then progress to a label comparing module 824 where labels, inherent properties, or characteristics of the corresponding terminals on the two opposing interfacing terminal layers are evaluated, compared, and any mismatches therebetween are sent over to flagging module 814.

Upon completing the functional integrity check/electrical rule check, the flagging module 814 reports its shape-based mismatch flags, the electrical connectivity flags, and potentially, any other flagged problems to the displaying module 826 which may then display such flags to a user directly or the flags may be directly stored into a memory location 828.

Figure 9:
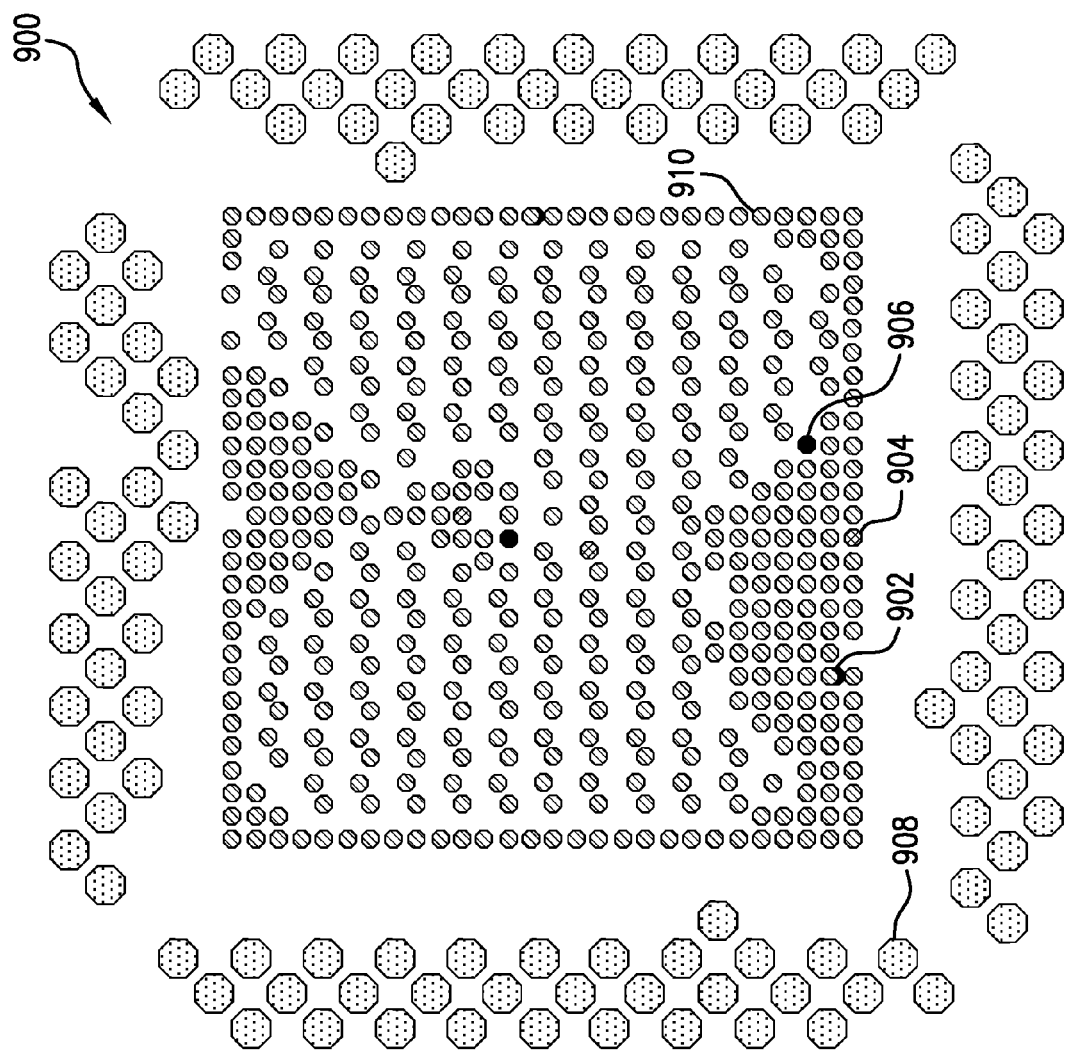
FIG. 9 is a schematic diagram of two interfacing chips superimposed upon each other.

FIG. 9 is a simplified composite layout of the micro-bump pads of the two stacked chips in the stacked multi-chip architecture represented by both the first and the second chip layout files. In such a representation of the two chips through the two chip layout files, it may be seen that a micro-bump pair 910 representing two corresponding micro-bump pads in vertical alignment between the two chip layout files form a pair and are indeed matched.

In contradistinction to the coupled micro-bump pair 910, it is seen that micro-bump 906 is only present on a single layer. While lone micro-bump 906 may only be present on a first chip layout file, micro-bump 904 may be seen to be on the second chip layout file interfacing terminal layer. Importantly though, it is seen that both micro-bumps 904 and 906 are each singular and indeed do not have a mating or corresponding micro-bump on an opposing interfacing terminal layer of an opposing chip represented by the chip layout files.

Micro-bump 902 may represent a condition where while there are indeed two corresponding micro-bumps in a specific location between the two interfacing terminal layers, a mismatched signal has been detected during the functional integrity check. This mismatching signal may be indicated by a mismatching label or mismatching intrinsic properties. In such an event, the comparator module would be utilized to detect such a signal mismatch.

Similar to micro-bump 906 it is seen that micro-bump 908 also is only present on a single interfacing terminal layer.

Figure 10:
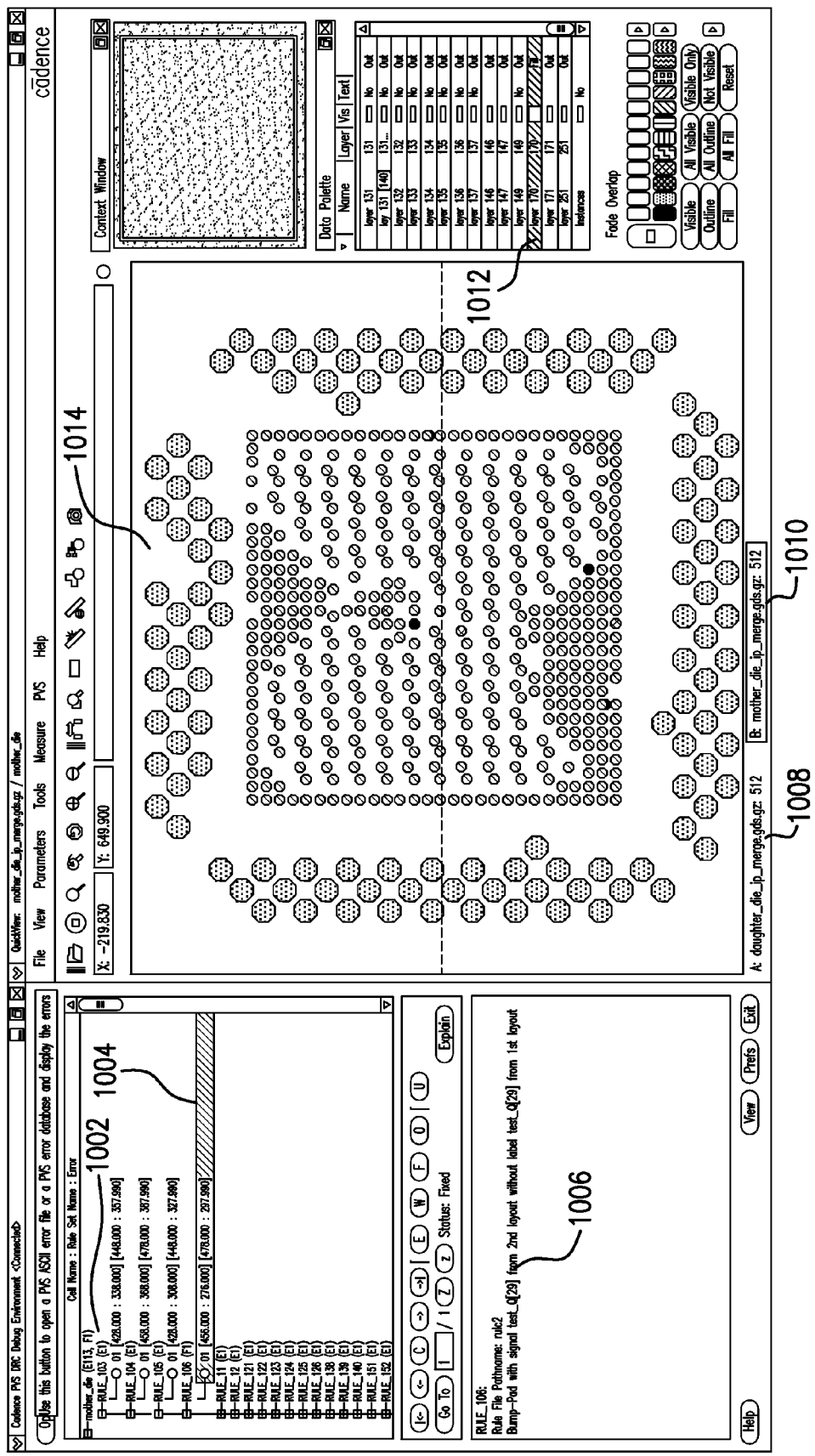
FIG. 10 is an exemplary screen shot of a user interface of a system for verifying terminal compatibility in a stacked multi-chip architecture in accordance with another exemplary embodiment of the present invention.

FIG. 10 is an exemplary user interface in accordance with various embodiments of the present invention. A first portion 1014 may show a superimposed composite image of the interfacing terminal layers of both the first and second chip layout files. Errors, mismatches, or flagged problem items may be displayed to the user in any way suitable to command the user's attention. Portions 1008 and 1010 may indicate two separate files which may optionally be used to feed the user interface.

As seen in FIG. 10, the two interfacing terminal layers of the first and second chip layout files need not necessarily be extracted and copied from their respective chip layout files into a solitary temporary test file—but instead, in an optional embodiment, a system or method of the subject invention may indeed take the two chip layout files, and be inhibited from aborting the program due to an unexpected condition, such as having two data files open simultaneously.

In such an embodiment, the two separate files may be made to share a single name by means known to one of skill in the art. For example, first chip layout file may be renamed to be in unity or identity with the second chip layout file. Preferably, the second chip layout file may be renamed to be identical to the first chip layout file. This provides the added benefit of being able to use an existing electronic design automation suite with minimal modifications to the software code thereof. Such approach allows an already established and distributed electronic design automation suite's capabilities to be greatly enhanced.

In the past, EDA suites were limited to evaluation of a single micro-chip at a time, modifications proposed herein may allow such an existing suite, with minor modifications, to be able to handle, debug, and ensure compatibility between two or more microprocessors or chips in a multi-chip stacked architecture. A portion of the user interface 1012 may indicated layers or allow a user to change shading or colors to more easily differentiate problems or structures on a first layer and a second layer.

Another portion 1002 or 1004 may display rules and/or rule violations. An exemplary rule may be that a certain type of signal mates with another certain type of signal. Another such rule may be that a power terminal mates with a similarly specified power terminal. A further portion 1006 may give more details on a rule violation upon selection by a user.

An illustrative example of pseudo-code to implement various embodiments is included in Prototype Verification System (PVS)—PVL syntax: ("//" indicates commenting).

LAYOUT_FORMAT gdsii; // Input Format of First Design
LAYOUT_FORMAT2 gdsii; // Specify input format of $2^{nd}$ Design
LAYOUT_PATH "mother_die_ip_merge.gds"; //Design Name and path to GDS
LAYOUT_PATH2 "daughter_die_ip_merge.gds"; //Design Name/Path
LAYOUT_PRIMARY mother_die; //Top Cell of First Design
LAYOUT_PRIMARY2 daughter_die; //Top Cell of Second Design
layout_include_box_record yes; //Define Box Records of hierarchy Cells
BUMP2 1000; // Increment $2^{nd}$ design GDS layers by 2000
REPORT_SUMMARY -drc xor.sum -hier; // Report Summary File

```
RESULTS_DB "TSV_XOR.ascii" -ascii -pseudo; //Results
    Database of Checks in ASCii
input_scale 2000; // Scale adjustment—to take care of differ-
    ent pitches of each design
abort_on_layout_error no; // Do Not abort—with multiple
    designs read-in
cell_case yes; // Case Sensitive. Cell-ABC in in one design is
    NOT the same as Cell-abc in the other
layout_case_sensitive yes; // Case sensitivity for input signal
    names
virtual_connect -colon yes; // Signals ending with : are
    implicit connected
Ivs_report_file "short_Ivs_report"; // Shorts between designs
    reported in this file
Ivs_find_shorts yes all; // Find Signal Shorts across designs
Layer Definitions
// Layer 37 dt 40 Metal-7
// Layer 137 dt 0 Metal-7 Text
// Layer 31 dt 140 MB
// Layer 131 dt 140 MB Text
Layer Mappings
LAYER_MAP 170 -datatype eq 0 170;
LAYER_DEF M7F1 170;
LAYER_DEF M7F1 170;
LAYER_MAP 170 -datatype eq 0 1170;
LAYER_DEF M7F2 1170;
flatten M7F1 M7__1; // Flatten Shapes—to enable Label
    attachments
flatten M7F2 M7__2; // Flatten Shapes—to enable Label
    attachments
// LAYER_MAP 131 -texttype eq 140 1999;
// LAYER_MAP 137 -texttype eq 0 999;
LAYER_DEF M7P__1 999; // Pin Layer Definition—First
    Design
LAYER_DEF M7P__2 1999; // Pin Layer Definition—Sec-
    ond design
include "TEXT/mother_die_text", // Labels attached from
    External File—Design 1
include "TEXT/daughter_die_text"; // Labels attached from
    External File—Design-2
include "TEXT/same_net"; // Same NetName information
    File
include "TEXT/rename_text"; // Renaming Text information
    file
AND M7__1 M7__2 M7__12; // Boolean for Virtual 3D-Via
    derivation
SIZE M7__12 -by 0.005 TSV; // Virtual-Via snapped to Grid
DISCONNECT; // Remove any pre-existing connectivity
TEXT_DEPTH 1; // Pick Primary Level Labels Only
TEXT_LAYER M7P__1; //Text Layer Definition—Design-1
TEXT_LAYER M7P__2; // Text Layer Definition—Design-2
ATTACH M7P__1 M7__1; // Attach Labels derived by sepa-
    rate ERC runs to Metal
ATTACH M7P__2 M7__2; // Attach Labels derived by sepa-
    rate ERC runs to Metal
CONNECT M7__1 M7__2 -by TSV; // Build Connectivity by
    derived VIA layer
STAMP M7__1 M7__2 -abut_also TSV_ERR; // Do NET
    stampings—and flag clash errors
Bump_Pad 3D_IC Alignment Check
RULE uBump_XOR{
XOR M7__1 M7__2 xor_out;
SELECT -INTERACT M7__1 xor_out layer1_sel;
SELECT -INTERACT M7__2 xor_out layer2_sel;
AND layer1_sel layer2_sel B;
SIZE B -by 0.1 C;
SELECT -INSIDE -not xor_out C;
}
OUTPUT -drc uBump_XOR -gds 19 0;
Sample Mother/Daughter Die Text File:
layout_text  "im_bweb[31]"  258.000  258.000  999
    mother_die
layout_text "i_bweb[30]" 258.000 288.000 999 mother_die
layout_text "i_bweb[28]" 258.000 318.000 999 mother_die
layout_text "i_bweb[26]" 258.000 348.000 999 mother_die
layout_text "i_bweb[25]" 258.000 378.000 999 mother_die
layout_text "i_bweb[23]" 258.000 408.000 999 mother_die
layout_text "i_bweb[22]" 258.000 438.000 999 mother_die
. . . .
Sample Same_Net Text File:
virtual_connect -name "VDD" "VSS" "GND";
Sample Rename_Text File:
rename_text SCANOUT SCANIN2;
rename_text SCANIN SCANOUT1;
```

As is seen in the above illustrative code example, a first and a second layout are read in. Any options or flags that disable "abort on multiple designs" should be set so as to enable the layout files of the two different chips to be read-in concurrently without triggering a fault condition in the particular EDA package.

To ensure that any two layers between the two designs are not identically numbered, and to provide easy layout distinctions, the layers of either of the layout files may be incremented by a suitably large number e.g. 2000. This will ensure that the minimum incremented layer of the second layout file is still outside of the range of layer numbers of the first layout file.

At least one of the layout files are then scaled to provide substantially identical dimensionality between the two layout files to allow for both structural integrity and functional integrity checks, including TSV forming, XOR shape-based checks, electrical rule checks, and bump comparisons.

Text labels for each terminal may be read in if they are in separate files. The text labels are then attached to corresponding layers of the respective first and second layout files. The layers may be flattened to incorporate the labels.

To start with a clean slate, existing connections are disconnected. To provide connectivity between the two layers, an AND Boolean operation may be performed on the two interfacing terminal layers to connect TSVs between any corresponding pair of terminals with one terminal on a first layer and the second paired terminal on the second layer.

Additionally, a XOR (Exclusive OR) shape-based check is performed against the two terminal layers. While the OR operation may be positive or true if either or both evaluated parameters are positive or true, the XOR operation will only return positive or true logic if one, and only one, of the evaluated parameters is true. XOR will return false or untrue if both evaluated parameters are true or neither are true. In this manner, any differences between the layers will be flagged.

Thereby a designer with minimal effort, expended time, reduced chance of errors, and reduced costs may have an automated system and method for verifying terminal compatibility in a stacked multi-chip architecture.

Although this invention has been described in connection with specific forms and embodiments thereof, it will be appreciated that various modifications other than those discussed above may be resorted to without departure from the spirit or scope of the invention. For example, equivalent elements may be substituted for those specifically shown and described, certain features may be used independently of other features, and in certain cases, particular combinations of circuit design and implementation flows or processing What is being claimed is:

1. A method for measuring terminal compatibility comprising:
    establishing a plurality of chip layout files corresponding to respective chips to be combined in stacked multi-chip manner, each chip layout file defining at least one interfacing terminal layer including a plurality of terminals for interconnection with another chip to be stacked therewith;
    forming an intermediate layer disposed between the first and second interfacing terminal layers, the intermediate layer including a plurality of vias passing therethrough, each defined to interconnect selected terminals of the first and second interfacing terminal layers;
    performing a structural integrity check, the structural integrity check including an interconnection survey between terminals of the first and second interfacing terminal layers;
    performing a functional integrity check, the functional integrity check including characterization of interconnections between terminals of the first and second interfacing terminal layers with respect to a predetermined signal and power map; and,
    identifying for a user, any terminals of the first and second interfacing terminal layers failing at least one of the structural and functional integrity checks.

2. The method for measuring terminal compatibility, as recited in claim 1, wherein the structural integrity check further includes a shape-based check of exclusive OR type.

3. The method for measuring terminal compatibility, as recited in claim 2, wherein the shape-based check includes an evaluation of corresponding terminal sizes.

4. The method for measuring terminal compatibility, as recited in claim 2, wherein the shape-based check includes an evaluation of corresponding terminal overlap.

5. The method for measuring terminal compatibility, as recited in claim 1, wherein the functional integrity check includes a comparison of corresponding terminal labels.

6. The method for measuring terminal compatibility, as recited in claim 1, further comprising: forming a test layout file, the test layout file including first and second interfacing terminal layers respectively corresponding to the interfacing terminal layers of the plurality of chip layout files.

7. The method for measuring terminal compatibility, as recited in claim 1, wherein the vias are formed as Through-Silicon Vias (TSVs).

8. A system for measuring terminal compatibility comprising:
    a computer processor;
    a storage memory coupled to said computer processor via a bus;
    a computer program configured to include software modules including:
        a layout module, operable to provide and maintain a plurality of chip layout files corresponding to respective chips to be combined in stacked multi-chip manner, each chip layout file defining at least one interfacing terminal layer including a plurality of terminals for interconnection with another chip to be stacked therewith;
        a via forming module, operable to form an intermediate layer disposed between the first and second interfacing terminal layers, the intermediate layer including a plurality of vias passing therethrough, each defined to interconnect selected terminals of the first and second interfacing terminal layers;
        a structural integrity check module, operable to perform a structural integrity check, the structural integrity check including an interconnection survey between terminals of the first and second interfacing terminal layers;
        a functional integrity module, operable to perform a functional integrity check, the functional integrity check including characterization of interconnections between terminals of the first and second interfacing terminal layers with respect to a predetermined signal and power map; and,
        an identifying module, operable to identify for a user, any terminals of the first and second interfacing terminal layers failing at least one of the structural and functional integrity checks.

9. The system for measuring terminal compatibility as recited in claim 8, wherein the structural integrity check further includes a shape-based check of exclusive OR type.

10. The system for measuring terminal compatibility as recited in claim 9, wherein the shape-based check includes an evaluation of corresponding terminal sizes.

11. The system for measuring terminal compatibility as recited in claim 9, wherein the shape-based check includes an evaluation of corresponding terminal overlap.

12. The system for measuring terminal compatibility as recited in claim 8, wherein the functional integrity check includes a comparison of corresponding terminal labels.

13. The system for measuring terminal compatibility as recited in claim 8, further comprising: a test layout generation module, operable to form an intermediate test layout file, the test layout file including first and second interfacing terminal layers respectively corresponding to interfacing terminal layers of the plurality of chip layout files.

14. The system for measuring terminal compatibility as recited in claim 7, wherein the vias are formed as Through-Silicon Vias (TSVs).

15. A computer program product for use with a computer, the computer program product comprising a non-transitory computer readable medium having a computer readable program code embodied therein for verifying chip compatibility for stacked multi-chip implementation comprising:
    establishing a plurality of chip layout files corresponding to respective chips to be combined in stacked multi-chip manner, each chip layout file defining at least one interfacing terminal layer including a plurality of terminals for interconnection with another chip to be stacked therewith;
    forming an intermediate layer disposed between the first and second interfacing terminal layers, the intermediate layer including a plurality of vias passing therethrough, each defined to interconnect selected terminals of the first and second interfacing terminal layers;
    performing a structural integrity check, the structural integrity check including an interconnection survey between terminals of the first and second interfacing terminal layers;
    performing a functional integrity check, the functional integrity check including characterization of interconnections between terminals of the first and second interfacing terminal layers with respect to a predetermined signal and power map; and,
    identifying for a user, any terminals of the first and second interfacing terminal layers failing at least one of the structural and functional integrity checks.

16. The computer program product for use with a computer, as recited in claim 15, wherein the structural integrity check further includes a shape-based check of exclusive OR type.

17. The computer program product for use with a computer, as recited in claim 16, wherein the shape-based check includes an evaluation of corresponding terminal sizes.

18. The computer program product for use with a computer, as recited in claim 16, wherein the shape-based check includes an evaluation of corresponding terminal overlap.

19. The computer program product for use with a computer, as recited in claim 15, wherein the functional integrity check includes a comparison of corresponding terminal labels.

20. The computer program product for use with a computer, as recited in claim 15, further comprising: forming a test layout file for an adjacent pair of chips in the stacked multi-chip implementation, the test layout file including first and second interfacing terminal layers respectively corresponding to the interfacing terminal layers of the plurality of chip layout files.

21. The computer program product for use with a computer, as recited in claim 15, wherein the vias are formed as Through-Silicon Vias (TSVs).

* * * * *